United States Patent
Shieh et al.

(10) Patent No.: US 7,975,212 B2
(45) Date of Patent: Jul. 5, 2011

(54) SEQUENTIAL DECODING METHOD AND APPARATUS THEREOF

(75) Inventors: Shin-Lin Shieh, Kinmen County (TW); Po-Ning Chen, Hsinchu (TW); Yung-Hsiang Han, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 922 days.

(21) Appl. No.: 11/924,584

(22) Filed: Oct. 25, 2007

(65) Prior Publication Data
US 2008/0222498 A1 Sep. 11, 2008

(30) Foreign Application Priority Data
Oct. 27, 2006 (TW) .............................. 95139739 A (51) Int. Cl.
*H03M 13/03* (2006.01)
(52) U.S. Cl. ........................................ 714/791; 714/796
(58) Field of Classification Search .................. 375/346, 375/341, 242, 260; 714/792, 791, 796
See application file for complete search history.

(56) References Cited

U.S. PATENT DOCUMENTS

| | | | |
|---|---|---|---|
| 4,933,956 A * | 6/1990 | Forney, Jr. ..................... | 375/341 |
| 5,208,816 A | 5/1993 | Seshardi et al. | |
| 5,208,834 A * | 5/1993 | Frederickson ................. | 375/242 |
| 5,416,801 A * | 5/1995 | Chouly et al. ................. | 375/260 |
| 5,787,129 A * | 7/1998 | Willming ....................... | 375/346 |
| 6,948,114 B2 * | 9/2005 | Potkonjak et al. ............. | 714/792 |
| 6,961,392 B2 * | 11/2005 | Heegard et al. ................ | 375/341 |

OTHER PUBLICATIONS

Article title "List Viterbi Decoding Algorithms with Applications" authored by Seshadri, et al., IEEE Transactions on Communications, vol. 42, No. 2/3/4, Feb./Mar./Mar./Apr. 1994 (pp. 313-323).

* cited by examiner

*Primary Examiner* — David Ton
(74) *Attorney, Agent, or Firm* — Jianq Chyun IP Office (57) ABSTRACT

A sequential decoding method and a decoding apparatus are provided. According to the method, an open stack is adopted for storing a plurality of paths. When the codeword generated by an internal decoder in the decoding apparatus is incorrect, a codeword is generated again by using the paths stored in the open stack. Accordingly, the complexity of decoding is reduced.

22 Claims, 6 Drawing Sheets

SEQUENTIAL DECODING METHOD AND APPARATUS THEREOF

CROSS-REFERENCE TO RELATED APPLICATION

This application claims the priority benefit of Taiwan application Ser. No. 95139739, filed on Oct. 27, 2006. All disclosure of the Taiwan application is incorporated herein by reference.

BACKGROUND OF THE INVENTION

1. Field of the Invention

The present invention relates to a decoding method. More particularly, the present invention relates to a sequential decoding method.

2. Description of Related Art

Figure 1:
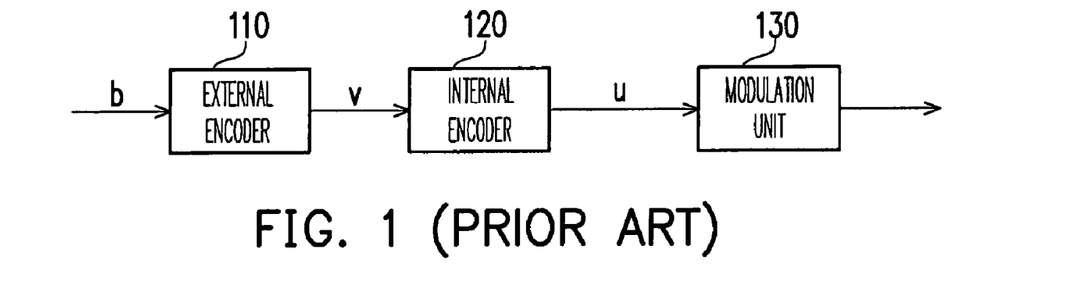
FIG. 1 is a block diagram illustrating a channel coding at a transmitter according to a conventional technique.

In a communication system, channel coding is required for baseband signal processing of a data to reliably transmit the data to a receiver through a channel. Existing channel coding usually includes more than two types of coding. FIG. 1 is a block diagram illustrating the channel coding at a transmitter according to a conventional technique.

Referring to FIG. 1, a message sequence b is first encoded into a first codeword V by an external encoder 110, then encoded into a second codeword u by an internal encoder 120, and modulated by a modulation unit 130 before it is transmitted into a channel. The aforementioned external encoder can be implemented with an error detection code, wherein the error detection code may be a cyclic redundancy check (CRC) code or a parity check code. The aforementioned internal encoder can be implemented with an error correction code, wherein the error correction code may be a trellis code which encodes or decodes through a trellis diagram, and the commonest trellis code is convolution code.

Corresponding to the transmitter, the received signal r received at the receiver through the channel has to be demodulated, internally decoded, and externally decoded to obtain a final output codeword $\hat{b}$ (if no error occurs, the final output codeword $\hat{b}$ is the message sequence b).

Figure 2:
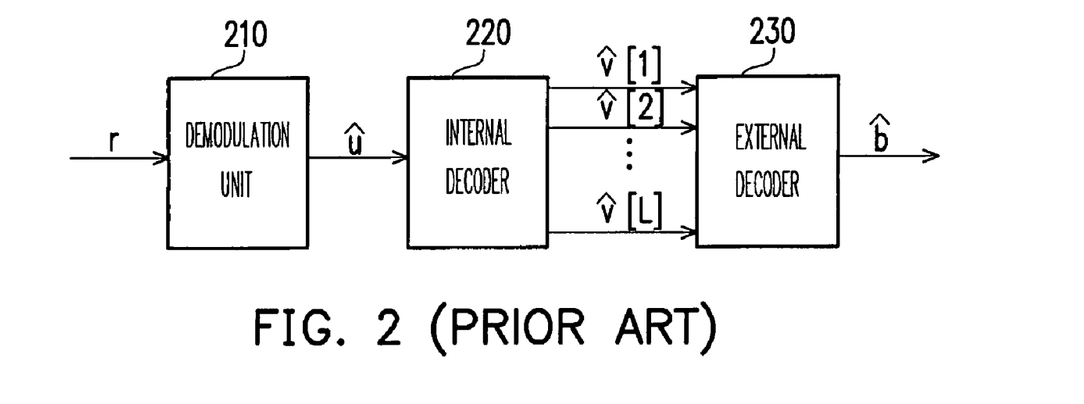
FIG. 2 is a block diagram illustrating a parallel Viterbi decoding at a receiver according to a conventional technique.
Figure 3:
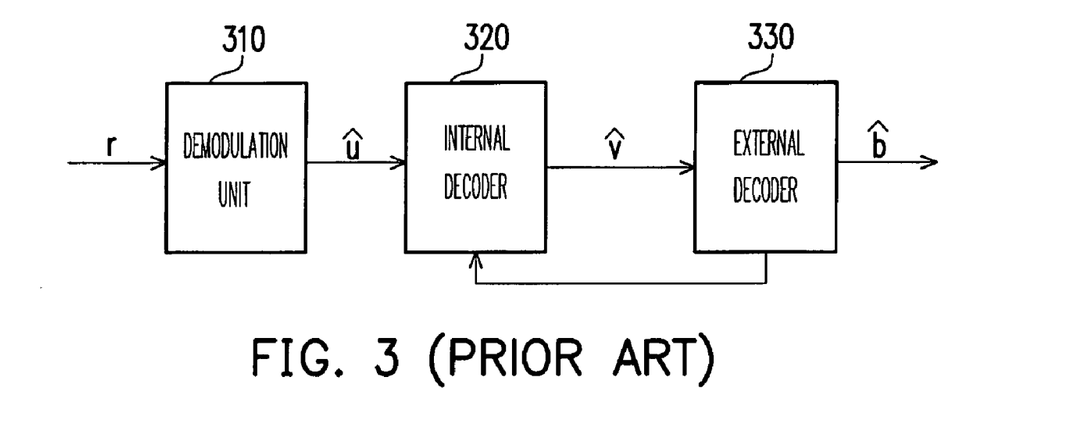
FIG. 3 is a block diagram illustrating a serial Viterbi decoding at a receiver according to a conventional technique.

The "Generalized Viterbi Decoding Algorithms" provided by the U.S. Pat. No. 5,208,816 and the article "List Viterbi Decoding Algorithm with Application" published by Nambirajan Seshadri and Carl-erik W. Sundberg in "Transactions on Communications" Vol. 42, No. 2/3/4, 1994 issued by the Institute of Electrical and Electronic Engineers (IEEE) among conventional techniques have provided methods for decoding to obtain the final output codeword $\hat{b}$ at the receiver by using Viterbi decoding and trellis diagram. Wherein Viterbi decoding is further divided into parallel Viterbi decoding and serial Viterbi decoding. FIG. 2 is a block diagram illustrating the parallel Viterbi decoding at a receiver according to a conventional technique, and FIG. 3 is a block diagram illustrating the serial Viterbi decoding at a receiver according to a conventional technique.

Referring to FIG. 2 first, the received signal r is demodulated into a first output codeword $\hat{u}$ by a demodulation unit 210 and is then sent to an internal decoder 220. The internal decoder 220 determines L paths similar to the first output codeword $\hat{u}$ through a trellis diagram and outputs L second output codewords $\hat{v}[1], \hat{v}[2] \ldots \hat{v}[L]$ respectively corresponding to L paths to an external decoder 230. Wherein the second output codeword corresponding to the path having the maximum likelihood is $\hat{v}[1]$ the second output codeword corresponding to the path having the second likelihood is $\hat{v}[2]$, and so on. The second output codewords are organized as $\hat{v}[1],\hat{v}[2], \ldots \hat{v}[L]$ according to the likelihood thereof which is calculated with a metric. After the external decoder 230 receives the L second output codewords $\hat{v}[1], \hat{v}[2], \ldots \hat{v}[L]$, the external decoder 230 sequentially determines whether the redundancy in the second output codewords are correct and obtains the final output codeword $\hat{b}$ through the second output codewords $\hat{v}[1], \hat{v}[2], \ldots \hat{v}[L]$ Referring to FIG. 3, the received signal r is demodulated into a first output codeword $\hat{u}$ by a demodulation unit 310 and is then sent to an internal decoder 320. The internal decoder 320 determines the path having the maximum likelihood through a trellis diagram and outputs a second output codeword $\hat{v}$ corresponding to the path having the maximum likelihood to an external decoder 330. The external decoder 330 determines whether the redundancy in the second output codeword $\hat{v}$ is correct. If the redundancy in the second output codeword $\hat{v}$ are correct, the external decoder 330 decodes the second output codeword $\hat{v}$ into the final output codeword $\hat{b}$, otherwise, the external decoder 330 requests the internal decoder 320 to output another second output codeword v. The internal decoder 320 then determines the path having the second likelihood through the trellis diagram and outputs a second output codeword $\hat{v}$ corresponding to the path having the second likelihood to the external decoder 330. As described above, the internal decoder 320 and the external decoder 330 work together to obtain the final output codeword $\hat{b}$.

However, during the parallel Viterbi decoding procedure, the metrics of extended successor paths on every state of every level of the trellis diagram have to be stored and calculated to determines the L similar paths. Thus, in actual application, a lot of calculations are required by parallel Viterbi decoding to output L second output codewords. Besides, in parallel Viterbi decoding, the metrics of the successor paths of all the nodes in the trellis diagram have to be calculated and L second output codewords have to be output to the external decoder regardless of the situation of the channel. Thus, the large quantity of calculation cannot be reduced in parallel Viterbi decoding even when the channel is in very good quality.

As to serial Viterbi decoding, in actual application, a lot of calculations are still required for calculating and storing the metrics of the successor paths extended from all the nodes even though only one second output codeword is output every time. Besides, before the final output codeword $\hat{b}$ is determined, the internal decoder has to start off from the origin node of the trellis diagram and decides an existence path on every state once again to output another second output codeword whenever the external decoder determines that the second output codeword is incorrect. Thus, if serial Viterbi decoding is implemented with hardware, a lot of memory space is required by the internal decoder for storing the metrics of all the paths in the trellis diagram, so as to provide different second output codewords.

SUMMARY OF THE INVENTION

Accordingly, the present invention is directed to a sequential decoding method, wherein a plurality of codewords corresponding to a plurality of smallest metric paths are generated by using a plurality of paths stored in an open stack, so as to reduce the quantity of calculation, the complexity of decoding, and the decoding time.

According to another aspect of the present invention, a decoding apparatus is provided, wherein a plurality of codewords corresponding to a plurality of smallest metric paths are generated sequentially by using an open stack in an internal decoder and the codewords are output to an external decoder, so as to reduce the memory space and the quantity of calculation required.

The present invention provides a sequential decoding method including following steps. In step (a), a decoding diagram is provided. Wherein the decoding diagram includes a plurality of paths and a plurality of nodes represents a message sequence passes there-through when a message sequence is encoded, the paths are between the nodes and each path corresponds to a codeword. In step (b), the origin node in the decoding diagram is placed into an open stack. In step (c), metrics of a plurality of successor paths extended from an end node of a smallest metric path in the open stack are calculated according to a received signal. In step (d), the smallest metric path in the open stack is deleted. In step (e), the successor paths are placed into the open stack. In step (f), whether the smallest metric path in the open stack reaches a terminal node of the decoding diagram is determined. If the smallest metric path does not reach the terminal node of the decoding diagram, the procedure returns to step (c), otherwise the codeword corresponding to the smallest metric path is output. In step (g), the smallest metric path in the open stack is deleted when the codeword corresponding to the smallest metric path in the open stack is incorrect, and the procedure returns to step (c).

According to an exemplary embodiment of the present invention, in the sequential decoding method described above, step (g) further includes following steps. Whether a redundancy in the codeword corresponding to the smallest metric path is correct is determined. If the redundant bit in the codeword corresponding to the smallest metric path is determined to be incorrect, the smallest metric path in the open stack is deleted and steps (c)~(g) are repeated, otherwise the codeword corresponding to the smallest metric path is an optimal codeword.

According to an exemplary embodiment of the present invention, in the sequential decoding method described above, the open stack is used for storing a plurality of paths, and the codewords corresponding to the paths have a possibility of being the optimal codeword.

According to an exemplary embodiment of the present invention, in the sequential decoding method described above, the metric of the origin node is 0.

According to an exemplary embodiment of the present invention, in the sequential decoding method described above, every node in the decoding diagram has a count.

According to an exemplary embodiment of the present invention, in the sequential decoding method described above, the count of every node in the decoding diagram is set to 0 and a maximum output number is set before step (b).

According to an exemplary embodiment of the present invention, in the sequential decoding method described above, step (d) further includes following steps. In step (d1), a specific value is accumulated to the count of the end node of the smallest metric path, wherein the specific value is 1. In step (d2), whether the count of the end node is greater than or equal to the maximum output number is determined. If the end node is determined to be greater than or equal to the maximum output number, the end node is placed into a closed stack and the procedure proceeds to step (d3), otherwise the procedure proceeds to step (d3). In step (d3), the smallest metric path in the open stack is deleted.

According to an exemplary embodiment of the present invention, in the sequential decoding method described above, step (e) further includes following steps. A specific path among the successor paths is eliminated when the specific path enters any node stored in the closed stack. The path having higher metric is eliminated when one of the successor paths merges with a path already stored in the open stack. The remaining successor paths are placed into the open stack. The paths stored in the open stack are arranged according to their metrics.

According to an exemplary embodiment of the present invention, in the sequential decoding method described above, the received signal is obtained through an external encoding and an internal encoding.

According to an exemplary embodiment of the present invention, in the sequential decoding method described above, the internal encoding is to encode k data bits into an n-bit codeword, the $j^{th}$ bit of the codeword corresponding to a path in the decoding diagram is denoted as $x_j$, and $x_j \in \{0,1\}$, a level of the path in the decoding diagram is denoted as l, and the metric thereof is $$\sum_{j=0}^{l \times n-1} (2x_j - 1) \times \phi_j + \sum_{j=0}^{l \times n-1} |\phi_j|,$$

wherein k and n are natural numbers, j and l are integers, $\phi_j$ is a real number and a log-likelihood ratio, and the value of $\phi_j$ is $\log[\Pr(u_j|0)/\Pr(u_j|1)]$, $u_j$ is the $j^{th}$ sample of the received signal, $\Pr(u_j|0)$ represents the possibility of receiving $u_j$ when transmitting 0, and $\Pr(u_j|1)$ represents the possibility of receiving $u_j$ when transmitting 1.

According to an exemplary embodiment of the present invention, in the sequential decoding method described above, the internal encoding is to encode k data bits into an n-bit codeword, the $j^{th}$ bit of the codeword corresponding to a path in the decoding diagram is denoted as $x_j$, and $x_j \in \{0,1\}$, a level of the path in the decoding diagram is denoted as l, and the metric thereof is $$\sum_{j=0}^{l \times n-1} (y_j \oplus x_j)|\phi_j|,$$

wherein k and n are natural numbers, j and l are integers, $\phi_j$ is a real number and a log-likelihood ratio, and the value of $\phi_j$ is $\ln[\Pr(u_j|0)/\Pr(u_j|1)]$, $u_j$ is the $j^{th}$ sample of the received signal, $\Pr(u_j|0)$ represents the possibility of receiving $u_j$ when transmitting 0, and $\Pr(u_j|1)$ represents the possibility of receiving $u_j$ when transmitting 1. $y_j$ is a hard-decision value, $y_j=1$ is determined when $\phi_j<0$, and $y_j=0$ is determined when $\phi_j>0$.

According to an exemplary embodiment of the present invention, in the sequential decoding method described above, the decoding diagram includes trellis diagram or tree diagram.

The present invention further provides a decoding apparatus for decoding a received signal into a final output codeword. The decoding apparatus at the receiver includes an internal decoder and an external decoder. The internal decoder uses a decoding diagram and starts off from an origin node of the decoding diagram. The internal decoder uses an open stack for storing all the paths while decoding the received signal passing there-through. Whenever a node of the decoding diagram is reached, the smallest metric path stored in the open stack is selected to advance. The metrics of a plurality of successor paths extended from an end node of the smallest metric path are calculated according to the received signal, and the successor paths are placed into the open stack. When the smallest metric path in the open stack reaches a terminal node of the decoding diagram, the internal decoder outputs a codeword corresponding to the smallest metric path. The external decoder receives the codeword corresponding to the smallest metric path for decoding the codeword corresponding to the smallest metric path and determines whether the codeword corresponding to the smallest metric path is correct, and outputs a final output codeword. If the external decoder determines that the codeword corresponding to the smallest metric path is incorrect, the internal decoder eliminates the smallest metric path in the open stack and uses a specific path in the open stack for replacing the smallest metric path. Wherein the specific path has the second smallest metric in the open stack. Once again, the internal decoder starts off from the end node of the smallest metric path and outputs the codeword corresponding to the smallest metric path to the external decoder when the smallest metric path reaches the terminal node of the decoding diagram. This process is performed until the external decoder determines that the codeword corresponding to the smallest metric path is correct.

According to an exemplary embodiment of the present invention, in the decoding apparatus described above, the received signal is obtained through an external encoding and an internal encoding. The internal encoding includes a trellis code, and the trellis code is a convolution code. The external encoding includes an error detection code, and the error detection code may be a cyclic redundancy check (CRC) code or a parity check code.

According to an exemplary embodiment of the present invention, in the decoding apparatus described above, the decoding diagram includes a plurality of paths and a plurality of nodes representing a message sequence passes through when the message sequence is encoded, wherein the paths are between the nodes, and each path is corresponding to a codeword.

According to an exemplary embodiment of the present invention, the decoding apparatus further includes a demodulation unit coupled to the internal decoder, and the demodulation unit demodulates the received signal into a first output codeword and outputs the first output codeword to the internal decoder.

According to an exemplary embodiment of the present invention, in the decoding apparatus described above, the decoding diagram includes a trellis diagram.

According to the present invention, an open stack is adopted so that a codeword can be generated by using a plurality of paths stored in the open stack when the codeword generated by the internal decoder is incorrect. Accordingly, the quantity of calculation, the complexity, and the time of decoding can be reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In a typical communication system, if a signal is encoded at least twice at the transmitter, the signal received at the receiver will be decoded at least twice. FIG. 1 is a block diagram illustrating the channel coding at a transmitter according to a conventional technique. The external encoder in FIG. 1 may be implemented with an error detection code, and the error detection code may be a cyclic redundancy check (CRC) code or a parity check code. The internal encoder may be implemented with an error correction code, wherein the error correction code may include trellis code, and the commonest trellis code is convolution code.

For the convenience of describing the embodiment, assuming a parity check code (x+1,x) is used for implementing the external encoder, and the length of a message sequence b is assumed to be 3 (i.e. assuming x=3), thus, a redundant bit $v_3$ is added to the 3-bit message sequence $b=(b_0, b_1, b_2)$ to become a first codeword $V=(b_0, b_1, b_2, v_3)$, wherein $b_0, b_1, b_2 \in \{0,1\}$. When the number of 1 in the message sequence b is an odd number, $V_3=1$, otherwise when the number of 1 in the message sequence b is an even number, $V_3=0$.

Figure 4:
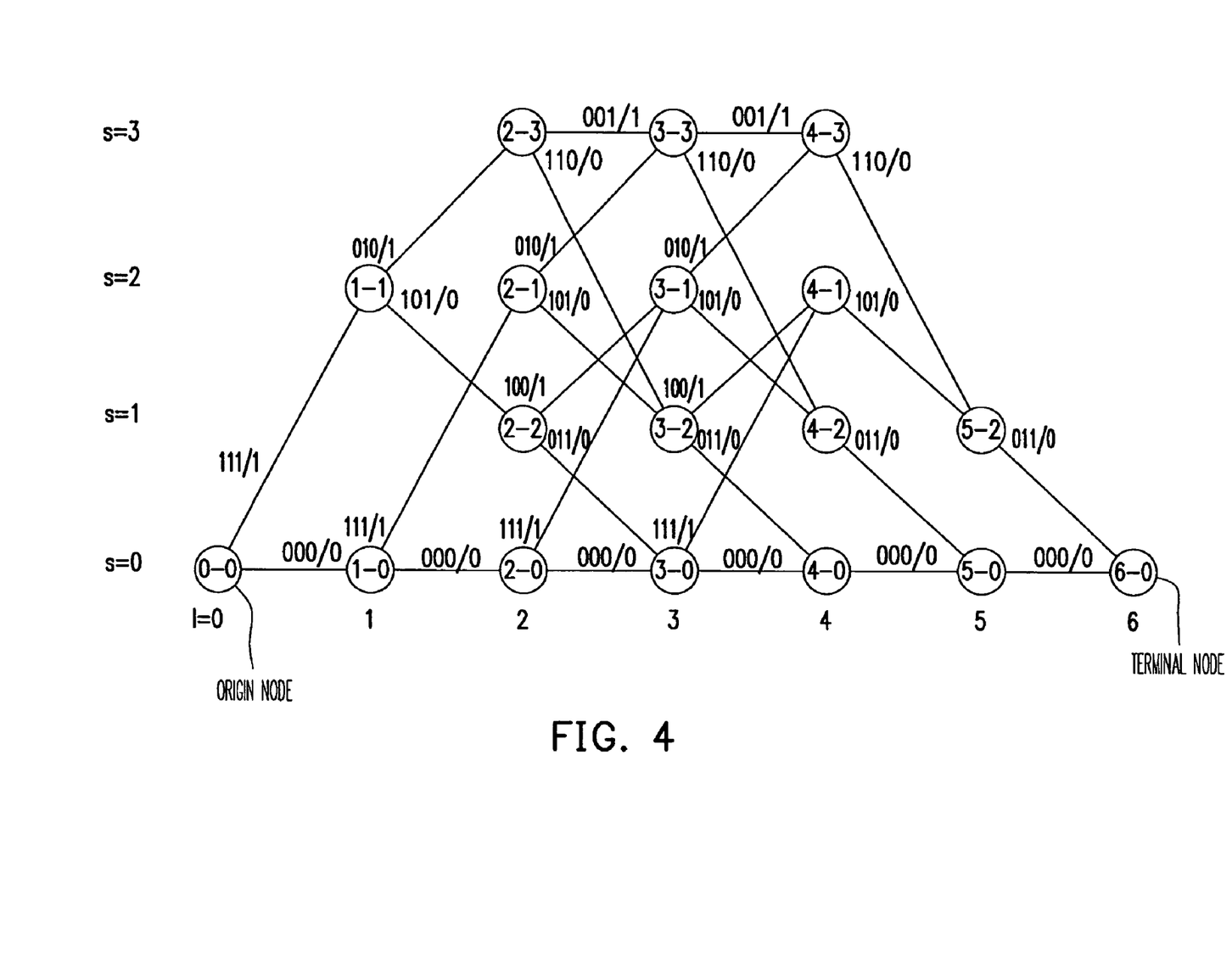
FIG. 4 is a trellis diagram of convolution code (3,1,2).

In following embodiments, assuming a convolution code (n, k, m) is used for implementing the internal encoder to encode the first codeword $\hat{v}$ into a second codeword u, and it is assumed that (n, k, m)=(3,1,2). FIG. 4 illustrates the trellis diagram used for encoding the 4-bit first codeword V by the convolution code (3,1,2). The trellis diagram includes nodes and the path corresponding to each node. Each of the nodes is denoted as l–s, wherein l represents level, and $l \in \{0,1,2,3,4,5,6\}$; s represents state, and $s \in \{0, 1, 2, 3\}$. The path starting off from each node corresponds to one input codeword and a 3-bit trellis code to be output. There are two paths starting off from each node when l=0~4, wherein the path on top starting off from the node is the path to be taken while the input codeword is 1 (i.e. the codeword corresponding to the path on top is 1), and the path below starting off from the node is the path to be taken while the input codeword is 0 (i.e. the codeword corresponding to the path below is 0). Thus, the paths selected from the origin node (0-0) to the terminal node (6-0) to be taken by each bit in the first codeword V determine the trellis code to be output, namely, determine the second codeword u output by the internal encoder.

Figure 5:
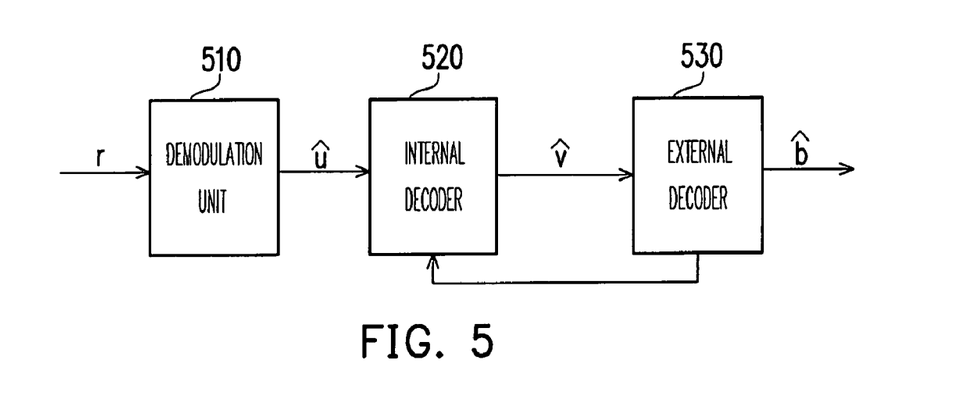
FIG. 5 is a block diagram of a decoding apparatus according to an exemplary embodiment of the present invention.

Corresponding to the transmitter, the signal r received at the receiver has to be demodulated, internally decoded, and externally decoded to obtain a final output codeword b. FIG. 5 is a block diagram of a decoding apparatus according to an exemplary embodiment of the present invention. Referring to FIG. 5, the decoding apparatus includes a demodulation unit 510, n internal decoder 520, and an external decoder 530. The demodulation unit 510 receives the signal r, demodulates it into a first output codeword U, and sends the first output codeword U to the internal decoder 520.

The internal decoder 520 uses a decoding diagram and starts off from the origin node of the decoding diagram, and the internal decoder 520 stores the paths that have been pass through for decoding into an open stack. The smallest metric path in the open stack is selected to advance whenever a node is reached. The metrics of a plurality of successor paths extended from the node are calculated according to the first output codeword $\hat{u}$, and the successor paths are placed in the open stack. When the smallest metric path (i.e. the path having maximum likelihood) in the open stack reaches a terminal node of the decoding diagram, the internal decoder 520 outputs the codeword corresponding to the smallest metric path, which is, the second output codeword $\hat{v}$ in FIG. 5.

In the present embodiment, the metric represents the likelihood of the first output codeword $\hat{u}$ received by the internal decoder 520 to a path in the decoding diagram. The decoding diagram includes a plurality of paths and a plurality of nodes representing a message sequence passes there-through while the message sequence is encoded, wherein the paths are between the nodes and each path corresponds to a codeword. In the present embodiment, the decoding diagram may be a trellis diagram or a tree diagram, and for the convenience of description, the decoding diagram will always be implemented in following embodiments with the trellis diagram in FIG. 4.

Referring to FIG. 5 again, the external decoder 530 is coupled to the internal decoder 520 for receiving the second output codeword $\hat{V}$, and the external decoder 530 decodes the second output codeword $\hat{V}$ and determines whether the codeword corresponding to the smallest metric path is correct, so as to output the final output codeword $\hat{b}$.

In the present embodiment, since a convolution code (3,1, 2) is used for internal encoding and the trellis diagram in FIG. 4 is used by the internal decoder 520, the second output codeword $\hat{V}$ received by the external decoder 530 can be denoted as $\hat{v}=(\hat{v}_0, \hat{v}_1, \hat{v}_2, \hat{v}_3, \hat{v}_4, \hat{v}_5)$, wherein $\hat{v}_4$ and $\hat{v}_5$ are invalid bits, and $\hat{v}_3$ is a redundant bit. Corresponding to the parity check code used by the external encoder 110 in FIG. 1, the external decoder 530 uses the redundant bit $\hat{v}_3$ in the second output codeword $\hat{v}$ for determining whether the second output codeword $\hat{v}$ is correct. If the external decoder 530 determines that the second output codeword $\hat{v}$ is correct, the external decoder 530 outputs the final output codeword $\hat{b}$, wherein $\hat{b}=(\hat{v}_0, \hat{v}_1, \hat{v}_2)$. Without any error, the final output codeword $\hat{b}$ is identical to the message sequence b in FIG. 1.

Contrarily, the external decoder 530 requires the internal decoder 520 to output another second output codeword $\hat{V}$ if the external decoder 530 determines that the second output codeword $\hat{V}$ is incorrect. The internal decoder 520 first eliminates the second codeword $\hat{V}$ output previously, namely, eliminates the smallest metric path in the open stack. After that, the internal decoder 520 replaces the smallest metric path with a specific path in the open stack, and the specific path may be the path having the second smallest metric in the open stack. Moreover, the internal decoder 520 starts off from the end node of the smallest metric path again and outputs the codeword corresponding to the smallest metric path to the external decoder 530 when the smallest metric path reaches the terminal node of the trellis diagram. In other words, when the external decoder 530 determines that the second output codeword $\hat{V}$ is incorrect, the internal decoder 520 re-generates a second output codeword $\hat{V}$ and outputs the newly-generated second output codeword $\hat{V}$ to the external decoder 530. The second output codeword $\hat{V}$ output here may be corresponds to a path having the second likelihood and the external decoder 530 determines once again whether the second output codeword $\hat{V}$ output by the internal decoder 520 is correct. Accordingly, through the cooperation of the internal decoder 520 and the external decoder 530, the internal decoder 520 outputs the second output codeword $\hat{V}$ to the external decoder 530 in order of the likelihood of the second output codeword $\hat{V}$ until the external decoder 530 determines the second output codeword $\hat{V}$ to be correct, so that the external decoder 530 can decodes the second output codeword $\hat{V}$ into the final output codeword $\hat{b}$ and obtain the message sequence b transmitted by the transmitter.

As described above, comparing with the Viterbi decoding in conventional techniques, the metrics of the successor paths extended from the smallest metric path in the open stack are only to be calculated in embodiments of the present invention. Moreover, when the external decoder determines that a codeword output by the internal decoder is incorrect, the internal decoder can generate another codeword by using the paths stored in the open stack and sends the new codeword to the external decoder. In other words, according to an embodiment of the present invention, it is not necessary to re-determine the maximum-likelihood path from the origin node of the trellis diagram as in conventional serial Viterbi decoding; thus, the usage of memory space and the complexity of calculation are reduced.

It should be mentioned that even though a possible pattern of the decoding apparatus has been described in the present embodiment, it should be understood by those skilled in the art that the design of the decoding apparatus may vary with different manufacturers, thus, the application of the present invention is not limited to the possible pattern described above. In other words, it is within the scope of the present invention as long as new codeword can be generated by using paths stored previously in an open stack. Next, how the internal decoder generates a second output codeword is explained with several embodiments so that those skilled in the art can implement the sequential decoding method in the present invention accordingly.

Figure 6:
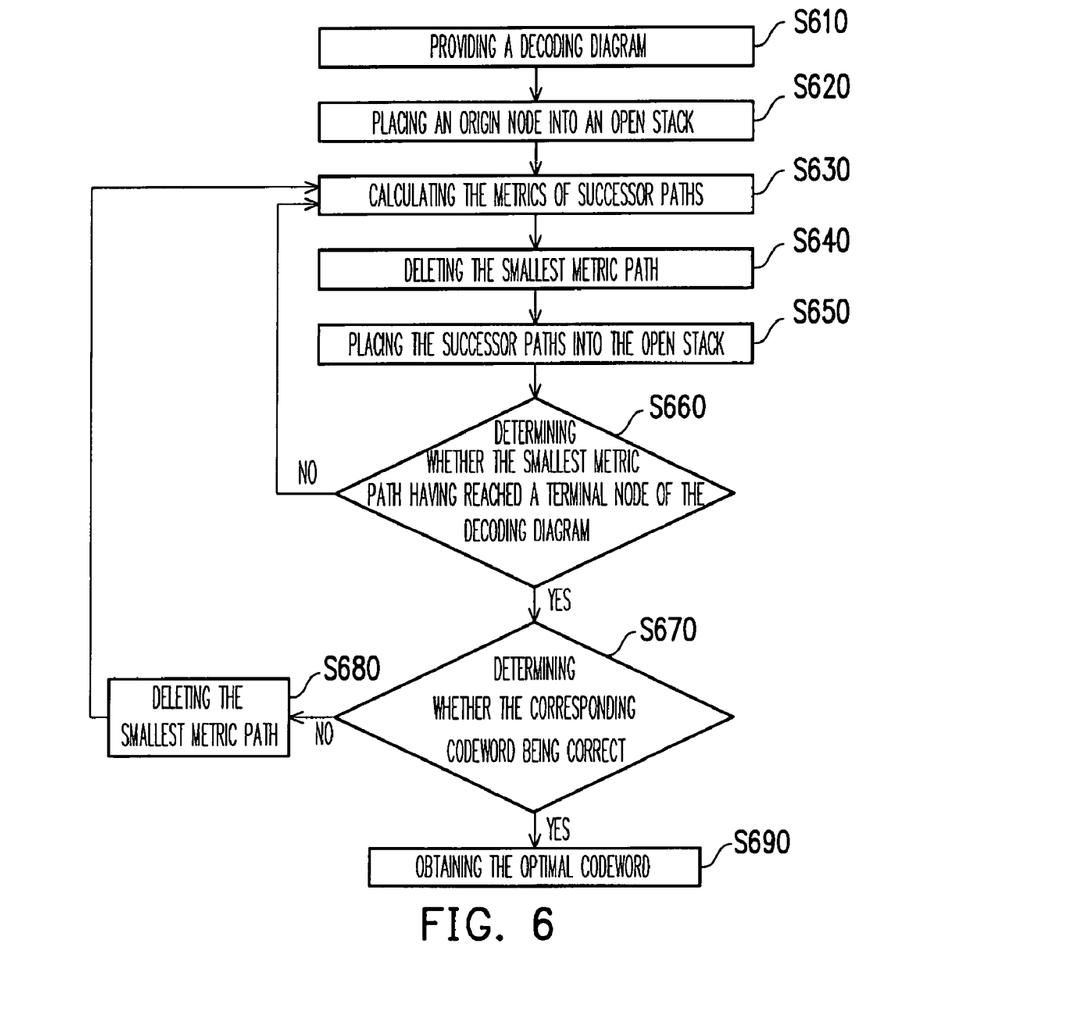
FIG. 6 is a flowchart illustrating a sequential decoding method according to an exemplary embodiment of the present invention.

FIG. 6 is a flowchart illustrating a sequential decoding method according to an exemplary embodiment of the present invention. Referring to FIG. 6, first, a decoding diagram is provided (step S610), wherein the decoding diagram includes a plurality of paths and a plurality of nodes represent a message sequence passes there-through while the message sequence is encoded, the paths are between the nodes, and each path is corresponding to a codeword. In the present embodiment, the decoding diagram may be implemented with a trellis diagram or a tree diagram, and for the convenience of description, the trellis diagram in FIG. 4 will always be used as an example in following embodiments.

In the beginning, a first path of the trellis diagram is placed into an open stack (step S620). The first path has only an origin node (such as the node 0-0 in FIG. 4), and the metric of the first path is 0. In the present embodiment, the open stack is used for storing the paths having passed through or extended while decoding a received signal.

Next, the metrics of a plurality of successor paths extended from the end node of the smallest metric path in the open stack are calculated according to the received signal (step S630).

Here the smallest metric path in the open stack is the first path, and the end node of the first path is the origin node 0-0. As shown in FIG. 4, the paths extended from the origin node 0-0 are path 0-0→1-0 and path 0-0→1-1, thus, the metrics of the path 0-0→1-0 and the path 0-01-1 are calculated in step S630. Wherein metric represents the likelihood of the first output codeword û received by the internal decoder 520 to a path in the trellis diagram.

After that, the smallest metric path in the open stack is deleted (step S640), and the successor paths are placed into the open stack (step S650). Here the first path stored in the open stack is deleted, and paths 0-0→1-0 and 0-0→1-1 are placed into the open stack. In the present embodiment, the successor paths may be placed in the open stack in the sequence of the metrics thereof, which may be from the path having the lowest metric to the path having the highest metric or vice versa, or the successor paths may be placed in the open stack randomly.

Next, whether the smallest metric path in the open stack has reached the terminal node (for example, node 6-0 in FIG. 1) of the trellis diagram is determined (step S660). If the smallest metric path among the paths stored in the open stack has not reached the terminal node of the trellis diagram, the procedure returns to step S630. Here since none of the paths stored in the open stack (for example, paths 0-0% 1-0 and 0-0→1-1 in FIG. 1) has reached the terminal node of the trellis diagram, the procedure returns to step S630, and the procedure starts off again from the smallest metric path among paths extended from the end node of path 0-0→1-0 or path 0-0→1-1 sequentially to reach the terminal node of the trellis diagram.

Contrarily, if the smallest metric path among the paths stored in the open stack has reached the terminal node of the trellis diagram, whether the codeword corresponding to the smallest metric path is correct is determined (step S670). In the present embodiment, the codeword corresponding to the smallest metric path is the second output codeword $\hat{v}$ output by the internal decoder 520 in FIG. 5. The redundant bit $\hat{v}_3$ in the second output codeword $\hat{v}$ may be used for determining whether the second output codeword $\hat{v}$ is correct.

If the codeword corresponding to the smallest metric path is determined to be incorrect, the smallest metric path stored in the open stack is deleted (step S680) and then the procedure returns to step S630, so that the procedure starts off again from the smallest metric path in the open stack, and another codeword corresponding to the smallest metric path is output when the terminal node of the trellis diagram is reached.

If the codeword corresponding to the smallest metric path is correct, the codeword is an optimal codeword (step S690). In the present embodiment, an optimal codeword is the codeword corresponding to the smallest metric path in the open stack, and the foregoing optimal codeword is a correct codeword.

The method for calculating the foregoing metrics will be explained below so that those having ordinary knowledge in the art can implement the present invention easily. First, the received first output codeword is denoted as $\hat{u}=(u_0, u_1, \ldots, u_N)$, wherein N is the length of the first output codeword. The message sequence obtained from a hard decision on the first output codeword is denoted as $y=(y_0, y_1, \ldots y_N)$, wherein any factor is:

$$y_j = \begin{cases} 1, & \text{if } \phi_j < 0 \\ 0, & \text{if } \phi_j \geq 0 \end{cases}$$

wherein $\phi_j$ is a log-likelihood ratio which is defined as:

$$\phi_j = \ln \frac{Pr(u_j|0)}{Pr(u_j|1)}$$

wherein $Pr(u_j|0)$ represents the possibility of receiving $u_j$ when transmitting 0, $Pr(u_j|1)$ represents the possibility of receiving $u_j$ when transmitting 1, and $\phi_j$ is a real number.

The codeword on any path in the trellis diagram can be denoted as and $x_{(l\cdot n-1)}=(x_0, x_1, \ldots, x_{l\cdot n-1})$. Wherein l represents the level of the end node of the path, n represents that every time k data bits are encoded into n trellis codes, l is a non-negative integer, and n and k are natural numbers. With path 0-0→1-1→2-3 in FIG. 4 as an example, the end node of this path is 2-3, the level l of the end node 2-3 is 2, and n=3, thus, the trellis code corresponding to path 0-0→1-1→2-3 is $x_5=111010$. The metrics can be calculated with two methods, wherein the first method is:

$$M_1(x_{(l\cdot n-1)}) \equiv \sum_{j=0}^{l\cdot n-1} (y_j \oplus x_j)|\phi_j| \quad (1)$$

and the second is:

$$M_2(x_{(l\cdot n-1)}) \equiv \sum_{j=0}^{l\cdot n-1} (2x_j - 1) \times \phi_j + \sum_{j=0}^{l\cdot n-1} |\phi_j| \quad (2)$$

The foregoing two methods both show that the more the codeword on the path is similar to the received signal, the smaller the metric is. Thus, the likelihood of the codeword corresponding to a path in the trellis diagram to the first output codeword can be determined by the metric of the path. Moreover, the metrics calculated by using formula (1) and formula (2) are both non-negative values, thus, the two calculation methods can both be applied to trellis diagram. And in step S630, only the metrics of the paths extended from the end node are to be calculated and added to the metric of the smallest metric path to obtain the metrics of the successor paths.

It should be mentioned here that since the factor $y_j$ is not used in formula (2), the hard decision step can be skipped when the second calculation method is adopted, accordingly the possibility of decision error is reduced and the performance of sequential decoding is improved relatively. For example, if the actual transmission channel is an additive white Gaussian noise (AWGN) channel, the log-likelihood ratio $\phi_j = C \cdot r_j$, wherein C is a constant, and formula (2) is converted to:

$$M_2(x_{(l\cdot n-1)}) \equiv C \cdot \left( \sum_{j=0}^{l\cdot n-1} (2x_j - 1) \times r_j + \sum_{j=0}^{l\cdot n-1} |r_j| \right) \quad (3)$$

It can be observed from formula (3) that when the second calculation method is used in the circuit of a receiver, the circuit for decision-making can be skipped and the hardware cost of the receiver can be reduced.

The sequential decoding method in the present invention will be further described in detail with reference to another embodiment of the present invention so that those having ordinary knowledge in the art can implement the present invention easily.

Figure 7:
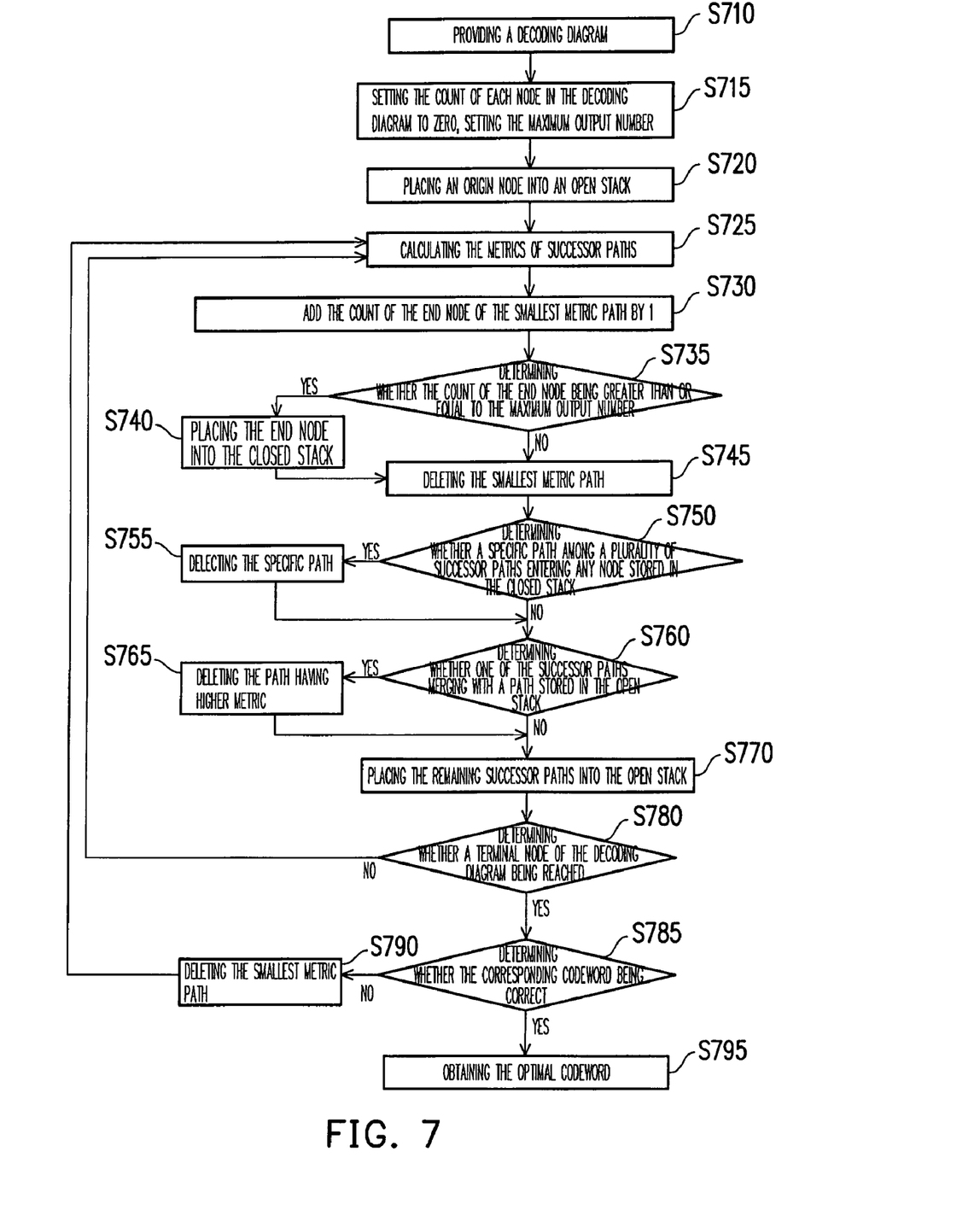
FIG. 7 is a flowchart illustrating a sequential decoding method according to an exemplary embodiment of the present invention.

FIG. 7 is a flowchart illustrating a sequential decoding method according to an exemplary embodiment of the present invention. Referring to FIG. 7, first, a decoding diagram is provided (step S710). Wherein the decoding diagram represents a plurality of paths and a plurality of nodes a message sequence passes through while encoding the message sequence, the paths are between the nodes, and each path is corresponding to a codeword. In the present embodiment, the decoding diagram may be implemented with a trellis diagram or a tree diagram, and for the convenience of description, the trellis diagram in FIG. 4 will be used as an example in following description.

Next, the count of each node in the trellis diagram is set to 0, and a maximum output number is set (step S715). In the present embodiment, a count is respectively set to each node in the trellis diagram, and the count is used for recording the number of successor paths extended from each node in the trellis diagram. The maximum output number (denoted as L thereinafter) represents the maximum number of extending successor paths from each node, in the present embodiment, the maximum output number is assumed to be L=3. The maximum output number is also used for representing the maximum number of second output codewords $\hat{v}$ to be output in FIG. 5. In other words, the maximum number of the second output codeword $\hat{v}$ being incorrect is L. When the channel environment is very poor and L second output codewords $\hat{v}$ output by the internal decoder 520 sequentially are all determined to be incorrect, the decoding apparatus requests the transmitter to re-send the received signal.

Referring to FIG. 7 again, a first path of the trellis diagram is placed into an open stack (step S720). Wherein the first path has only an origin node (for example, node 0-0 in FIG. 4), and the metric of the first path is 0. In the present embodiment, the open stack is used for storing paths having passed through or extended during the decoding procedure.

Next, the metrics of a plurality of successor paths extended from the end node of the smallest metric path in the open stack are calculated according to the received signal (step S725). Here the smallest metric path in the open stack is the first path, and the end node of the first path is the origin node 0-0. As shown in FIG. 4, the paths extended from the origin node 0-0 are path 0-0→1-0 and path 0-01-1, thus, the metrics of the successor paths 0-0→1-0 and 0-0→1-1 are calculated in step S630. In the present embodiment, the metrics may be calculated with one of the foregoing formula (1) and formula (2) but is not limited thereto.

After that, a specific value is added to the count of the end node of the smallest metric path (step S730). In the present embodiment, the specific value may be 1, however, it is not limited in the present invention. Here the end node of the smallest metric path is the end node of the first path (i.e. node 0-0 in FIG. 4), and the specific value (for example, 1) is accumulated to the count 0 of node 0-0 in step S730 so that the count of node 0-0 becomes 1.

Whether the count of the end node of the smallest metric path is greater than or equal to the maximum output number L is then determined (step S735), wherein the end node is the end node of the first path (i.e. node 0-0 in FIG. 4). If the count of the end node is greater than or equal to the maximum output number L, the end node is placed into a closed stack (step S740) and the procedure proceeds to step S745; otherwise, if the count of the end node is smaller than the maximum output number L, the procedure directly enters step S745. Here since the count of the end node is 1 and which is smaller than the maximum output number L (assumed to be 3 in the present embodiment), the procedure proceeds to step S745.

In the present embodiment, the closed stack is used for storing a plurality of nodes, and the end node information of those previous smallest metric paths in the open stack is stored in the closed stack, wherein the end node information includes the level and state of an end node. Namely, a path does not advance anymore if the end node of the path is the same as a node stored in the closed stack.

After that, the smallest metric path in the open stack is deleted (step S745). Here only the first path is in the open stack, thus, the first path is deleted so that there is no path in the open stack.

Next, whether a specific path among a plurality of successor paths enters any node stored in the closed stack is determined (step S750). If there is a specific path among the successor paths, the specific path is eliminated (step S755) and subsequent steps are proceeded to. If there is no such a specific path among the successor paths, the procedure directly proceeds to the subsequent steps. Here the successor paths include path 0-0→1-0 and path 0-0→1-1, and there is no node in the closed stack, thus, the procedure directly proceeds to subsequent steps.

Next, whether one of the successor paths merges with a path stored in the open stack is determined (step S760). If one of the successor paths merges with a path stored in the open stack, the path having higher metric is deleted (step S765) and the procedure proceeds to the subsequent steps; otherwise the procedure proceeds directly to the subsequent steps. Here since there is no path stored in the open stack, the procedure directly proceeds to subsequent steps.

After that, the remaining successor paths are placed into the open stack (step S770). Here since steps S755 and S765 have not been performed, no path is deleted. Thus, in step S770, the paths 0-0→1-0 and 0-0→1-1 are placed into the open stack. In the present embodiment, after the successor paths are placed into the open stack, all the paths stored in the open stack may be re-arranged in the sequence of increasing metrics, so that the top most path in the open stack can be obtained directly as the smallest metric path in step S725. If the paths stored in the open stack have been arranged in sequence according to their metrics before the successor paths are placed into the open stack, then the successor paths are inserted into the paths stored in the open stack which have been arranged sequentially according to the metrics of the successor paths, so that all the paths stored in the open stack can be arranged in sequence according to their metrics.

Next, whether the smallest metric path in the open stack has reached the terminal node of the trellis diagram (for example, node 6-0 in FIG. 1) is determined (step S780). If the smallest metric path in the open stack has not reached the terminal node of the trellis diagram, the procedure returns to step S725. Here since neither of the paths stored in the open stack (for example, path 0-0→1-0 and path 0-0→1-1 in FIG. 1) has reached the terminal node of the trellis diagram, the procedure returns to step S725 and once again, the procedure starts off from the smallest metric path among the paths extended from the end nodes of path 0-0→1-0 and path 0-01-1 sequentially to reach the terminal node of the trellis diagram.

Contrarily, if the smallest metric path in the open stack has reached the terminal node of the trellis diagram, then whether a redundant bit in the codeword corresponding to the smallest metric path is correct is determined (step S785). In the present embodiment, the codeword corresponding to the smallest metric path is the second output codeword $\hat{v}$ output by the internal decoder 520 in FIG. 5. The redundant bit $\hat{v}_3$ in the second output codeword $\hat{v}$ is used for determining whether the second output codeword $\hat{V}$ is correct.

If the codeword corresponding to the smallest metric path is determined to be incorrect, the smallest metric path stored in the open stack is deleted (step S790) and the procedure returns to step S725, so that once again the procedure starts off from the smallest metric path in the open stack and outputs the codeword corresponding to the smallest metric path when the terminal node of the trellis diagram is reached.

If the codeword corresponding to the smallest metric path is determined to be correct, the codeword is an optimal codeword (step S795). In the present embodiment, the optimal codeword is the codeword corresponding to the smallest metric path in the open stack and the optimal codeword is a correct codeword.

However, it can be observed by those having ordinary knowledge in the art that if the codeword corresponding to the smallest metric path is determined to be incorrect in step S785, a codeword corresponding to the smallest metric path stored in the open stack can be output again by starting off from the end node the smallest metric path in the open stack after the previous smallest metric path in the open stack is deleted and performing the subsequent steps. In an embodiment of the present invention, it is not necessary to return to the origin node of the trellis diagram or re-decide an existence path on every level to output another codeword corresponding to the smallest metric path (i.e. to allow the internal encoder to output another second output codeword $\hat{v}$). Thus, the complexity and time of calculation are reduced in actual application, and only the paths in the open stack are stored in the internal decoder so that the memory space in the internal decoder is also reduced.

Figure 8:
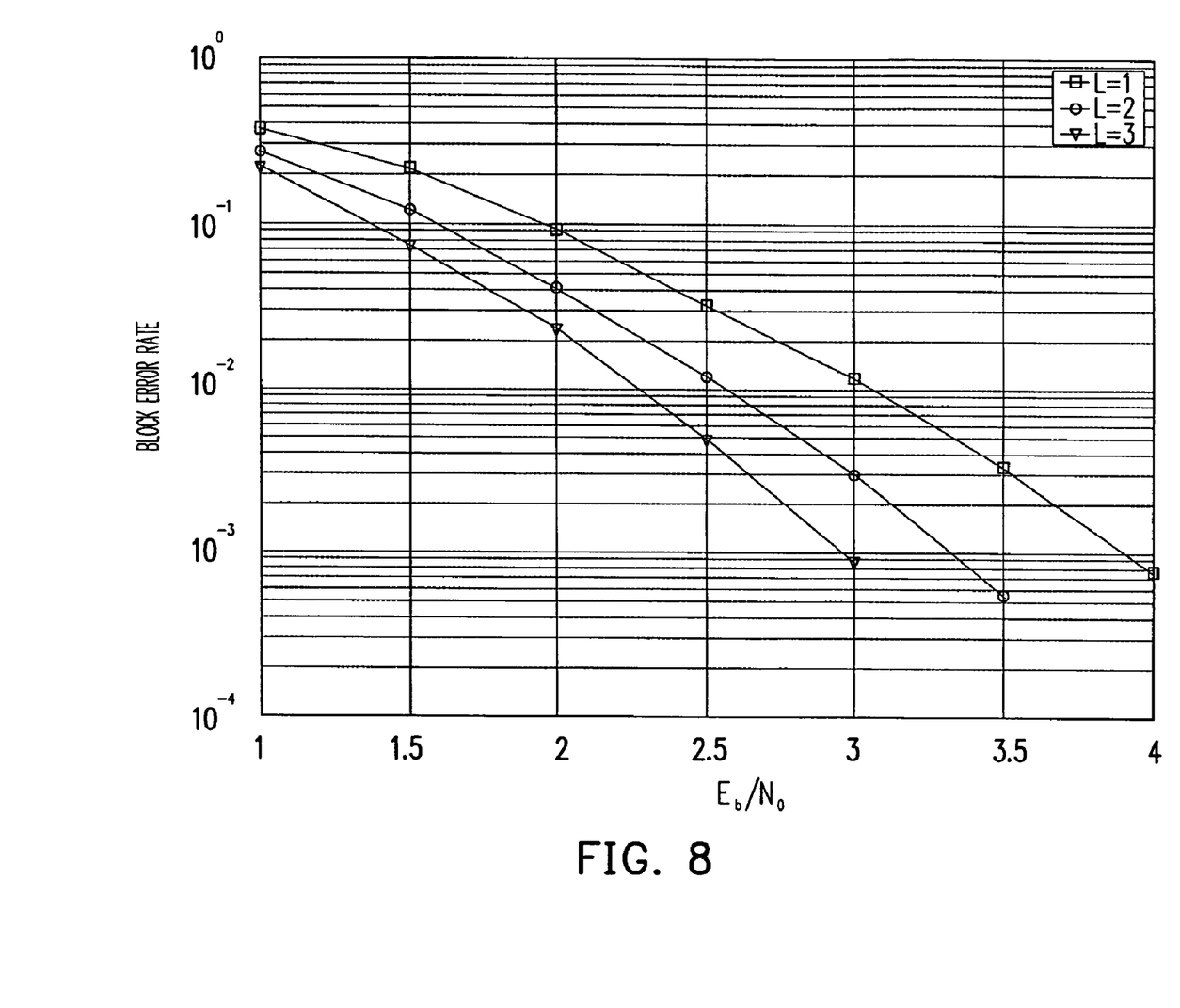
FIG. 8 is a trend diagram illustrating an error rate of the sequential decoding method in an embodiment of the present invention with different maximum output number L and a message sequence of length 100.
Figure 9:
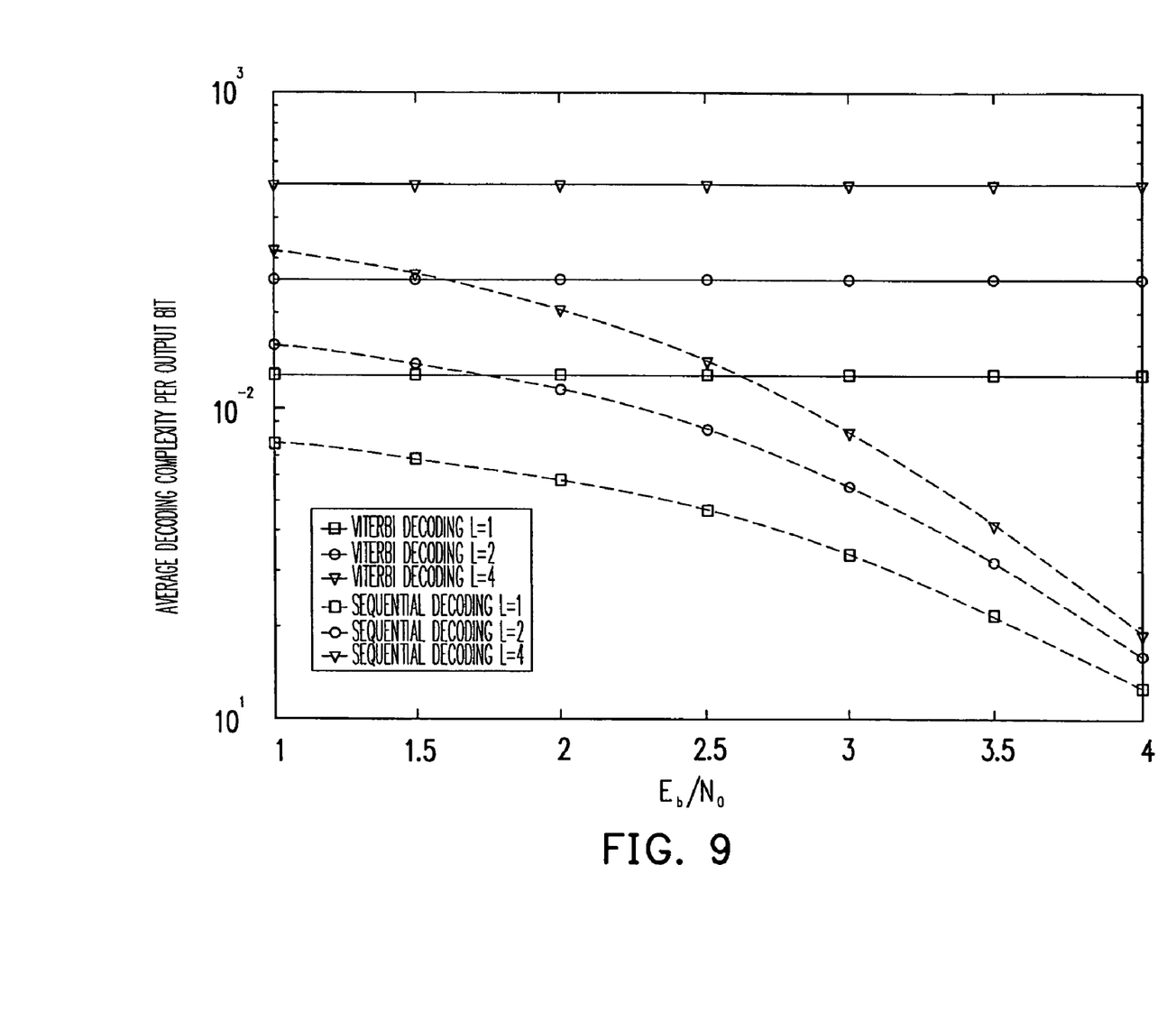
FIG. 9 is a trend diagram illustrating an average decoding complexity per output bit of the sequential decoding method in an embodiment of the present invention and that of the conventional parallel Viterbi decoding method with different maximum output number L and a message sequence of length 100.

The sequential decoding method described above may be simulated with a program. FIGS. 8 and 9 are simulative diagrams under various encoding conditions, and wherein calculation complexities in the present invention and conventional Viterbi decoding are compared. AWGN channel will be used as the transmission channel in following simulations.

FIG. 8 is a trend diagram illustrating the error rate of the sequential decoding method in an embodiment of the present invention with different maximum output number L and a message sequence of length 100. Referring to FIG. 8, the abscissa denotes the signal to noise ratio $E_b/N_0$, the unit thereof is dB, and the ordinate denotes block error rate. The three curves in FIG. 8 are respectively simulated with the maximum output number L=1, 2, and 4. It can be understood from FIG. 8 that with the same value of $E_b/N_0$, the larger L is, the lower block error rate is obtained. Besides, when $E_b/N_0$=2.5, the block error rate of the sequential decoding method with L=1 is $10^{-1.8}$, the block error rate of the sequential decoding method with L=2 is $10^{-2}$, and the block error rate of the sequential decoding method with L=4 is $10^{-1.6}$. In other words, the sequential decoding method provided by the present invention can still render a very low block error rate even when the value of $E_b/N_0$ is very large.

FIG. 9 is a trend diagram illustrating the average decoding complexity per output bit of the sequential decoding method in an embodiment of the present invention and that of the conventional parallel Viterbi decoding method with different maximum output number L and a message sequence of length 100. Referring to FIG. 9, the abscissa denotes the signal to noise ratio $E_b/N_0$, the unit thereof is dB, and the ordinate denotes the average decoding complexity per output bit. The three dotted lines in FIG. 9 are obtained by using the sequential decoding method in the present invention and which are respectively simulated with the maximum output number L=1, 2, and 4. The three real lines in FIG. 9 are obtained by using the parallel Viterbi decoding method and are respectively simulated with the maximum output number L=1, 2, and 4.

It can be understood from FIG. 9 that parallel Viterbi decoding always output the same number of second codewords to the external decoder regardless of the quality of the channel, thus, the three real lines in FIG. 9 are all straight lines, which means the complexity of decoding cannot be reduced regardless of the channel quality in parallel Viterbi decoding. Instead, the complexity of decoding in the sequential decoding method provided by the present invention is obviously lower than that in parallel Viterbi decoding, and when the channel has good quality, the complexity of decoding in the present invention is less than half of that in parallel Viterbi decoding. For example, when the signal to noise ratio $E_b/N_0$=4 and the maximum output number L=3, the average of the complexity of sequential decoding is about $10^1$, while the average of the complexity of parallel Viterbi decoding is about $10^{2.5}$, thus, the complexity of parallel Viterbi decoding is about 31 times of that of the sequential decoding method in the present invention.

In summary, according to the sequential decoding method and decoding apparatus in an embodiment of the present invention, the internal decoder re-generates a codeword by using paths stored in the open stack and outputs the codeword to the external decoder only when the external decoder determines the previous codeword output by the internal decoder to be incorrect. Thus, the quantity of calculation can be reduced when the channel has good quality.

Moreover, according to the sequential decoding method and decoding apparatus in an embodiment of the present invention, the internal decoder re-generates a second output codeword by using only the paths stored in the open stack and outputs the second output codeword to the external decoder when the external decoder determines the previous codeword output by the internal decoder to be incorrect. In other words, it is not necessary to re-locate the maximum-likelihood path from the origin node of the trellis diagram when the external decoder determines the codeword output by the internal decoder to be incorrect. Thus, the complexity and time of decoding can be reduced greatly. In addition, not like the conventional serial Viterbi decoding technique, the sequential decoding method in the present invention does not require a large memory for storing the metrics of all the paths, accordingly, the memory space required is reduced greatly.

In actual application, the sequential decoding method in the present invention can be either applied to an integrated circuit (IC) as hardware or written into software to be applied to a digital signal processing (DSP) platform.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sequential decoding method, comprising:
   (a) providing a decoding diagram, the decoding diagram including a plurality of paths and a plurality of nodes representing a message sequence passing there-through when the message sequence is encoded, the paths being between the nodes, each of the paths being corresponding to a codeword;
(b) placing an origin node of the decoding diagram into an open stack;
(c) calculating metrics of a plurality of successor paths extended from an end node of a smallest metric path in the open stack according to a received signal;
(d) deleting the smallest metric path in the open stack;
(e) placing the successor paths into the open stack;
(f) determining whether the smallest metric path in the open stack reaching a terminal node of the decoding diagram, wherein when smallest metric path in the open stack reaches the terminal node of the decoding diagram, the codeword corresponding to the smallest metric path is output, otherwise the procedure returns to step (c); and
(g) determining whether the codeword corresponding to the smallest metric path in the open stack being incorrect, wherein when the codeword corresponding to the smallest metric path in the open stack is incorrect, the smallest metric path in the open stack is deleted and the procedure returns to step (c).

2. The sequential decoding method as claimed in claim 1, wherein step (g) comprises:
determining whether a redundancy of the codeword corresponding to the smallest metric path is correct; and
deleting the smallest metric path in the open stack when the redundancy of the codeword corresponding to the smallest metric path is incorrect, and repeating steps (c)~(g);
wherein when the redundancy of the codeword corresponding to the smallest metric path is correct, the codeword corresponding to the smallest metric path is considered as an optimal codeword.

3. The sequential decoding method as claimed in claim 2, wherein the open stack is used for storing the paths, and the codewords corresponding to the paths have a possibility being the optimal codeword.

4. The sequential decoding method as claimed in claim 1, wherein the metric of the origin node is 0.

5. The sequential decoding method as claimed in claim 1, wherein the nodes in the decoding diagram respectively have counts, before step (b) the counts of each of the nodes in the decoding diagram is set to 0.

6. The sequential decoding method as claimed in claim 4, wherein a maximum output number is set before step (b).

7. The sequential decoding method as claimed in claim 6, wherein step (d) further comprises:
(d1) accumulating a specific value to the count of the end node from the smallest metric path;
(d2) determining whether the count of the end node from the smallest metric path being greater than or equal to the maximum output number, wherein when the count of the end node from the smallest metric path is greater than or equal to the maximum output number, the end node of the smallest metric path is placed into; and
(d3) deleting the smallest metric path in the open stack.

8. The sequential decoding method as claimed in claim 7, wherein the specific value is 1.

9. The sequential decoding method as claimed in claim 7, wherein step (e) further comprises:
eliminating a specific path among the successor paths when the specific path entering any node stored in the closed stack;
when two paths merging with each other, including one of the successor paths and a path already stored in the open stack, eliminating one having higher metric from the two merged paths;
placing the successor paths into the open stack.

10. The sequential decoding method as claimed in claim 9, further comprising a step of arranging the paths stored in the open stack according to the metrics thereof after the step of placing the successor paths into the open stack.

11. The sequential decoding method as claimed in claim 1, wherein the received signal is obtained through an external encoding and an internal encoding.

12. The sequential decoding method as claimed in claim 11, wherein the internal encoding is a convolution code.

13. The sequential decoding method as claimed in claim 11, wherein the external encoding is a cyclic redundancy check (CRC) code or a parity check code.

14. The sequential decoding method as claimed in claim 11, wherein the internal encoding is used for encoding k data bits into an n-bit codeword, the $j^{th}$ bit of the codeword corresponding to a path in the decoding diagram is denoted as $x_j$, and $x_j \in \{0,1\}$, a level of the path in the decoding diagram is denoted as l, and the metric thereof is $$\sum_{j=0}^{l \times n-1} (2x_j - 1) \times \phi_j + \sum_{j=0}^{l \times n-1} |\phi_j|,$$

wherein k and n are natural numbers, j and l are integers, $\phi_j$ is a real number and a log-likelihood ratio.

15. The sequential decoding method as claimed in claim 14, wherein the value of $\phi_j$ is log[Pr($u_j$|0)/Pr($u_j$|1)], $u_j$ is a the $j^{th}$ sample of the received signal, Pr($u_j$|0) represents the possibility of receiving $u_j$ when transmitting 0, and Pr($u_j$|1) represents the possibility of receiving $u_j$ when transmitting 1.

16. The sequential decoding method as claimed in claim 11, wherein the internal encoding is used for encoding k data bits into an n-bit codeword, the $j^{th}$ bit of the codeword corresponding to a path in the decoding diagram is denoted as $x_j$, and $x_j \in \{0,1\}$, a level of the path in the decoding diagram is denoted as l, and the metric thereof is $$\sum_{j=0}^{l \times n-1} (y_j \oplus x_j)|\phi_j|,$$

wherein k and n are natural numbers, j and l are integers, $\phi_j$ is a real number and a log-likelihood ratio, and $y_j$ is a hard-decision value.

17. The sequential decoding method as claimed in claim 16, wherein the value of $\phi_j$ is ln[Pr($u_j$|0)/Pr($u_j$|1)], $u_j$ is a the $j^{th}$ sample of the received signal, Pr($u_j$|0) represents the possibility of receiving $u_j$ when transmitting 0, and Pr($u_j$|1) represents the possibility of receiving $u_j$ when transmitting 1.

18. The sequential decoding method as claimed in claim 17, wherein $y_j=1$ is determined when $\phi_j<0$, and $y_j=0$ is determined when $\phi_j \geq 0$.

19. The sequential decoding method as claimed in claim 1, wherein the decoding diagram is a trellis diagram or a tree diagram.

20. A decoding apparatus, suitable for decoding a received signal into a final output codeword, comprising:
an internal decoder, using a decoding diagram, starting off from an origin node of the decoding diagram, using an open stack for storing paths while decoding the received signal passing there-through, and outputting a codeword corresponding to a smallest metric path when the smallest metric path in the open stack reaches a terminal node of the decoding diagram, wherein the smallest metric path in the open stack is selected to advance when a node during the decoding diagram, the metrics of a plurality of successor paths extended from the end node of the smallest metric path are calculated according to the received signal, and the plurality of successor paths are placed into the open stack; and an external decoder, for determining whether the codeword corresponding to the smallest metric path being correct, wherein when the codeword corresponding to the smallest metric path is correct, the final output codeword is output;

wherein when the external decoder determines that the codeword corresponding to the smallest metric path is incorrect, the internal decoder eliminates the smallest metric path in the open stack and selects a specific path in the open stack to replace the smallest metric path, then the internal decoder starts off from the end node of the smallest metric path and outputs the codeword corresponding to the smallest metric path to the external decoder when the smallest metric path reaches the terminal node of the decoding diagram.

21. The decoding apparatus as claimed in claim 20, wherein the decoding diagram including a plurality of paths and a plurality of nodes represents a message sequence passes there-through when the message sequence is encoded, the paths are between the nodes, and each of the paths is corresponding to the codeword.

22. The decoding apparatus as claimed in claim 20, wherein the decoding diagram is a trellis diagram or a tree diagram.

* * * * *